(12) United States Patent
Fujii

(10) Patent No.: US 7,407,391 B2
(45) Date of Patent: Aug. 5, 2008

(54) JOINING STRUCTURE BETWEEN CERAMIC SUBSTRATE AND POWER SUPPLY CONNECTOR

(75) Inventor: Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/553,216

(22) Filed: Oct. 26, 2006

(65) Prior Publication Data
US 2007/0097603 A1   May 3, 2007

(30) Foreign Application Priority Data
Oct. 28, 2005   (JP) ............... 2005-314603

(51) Int. Cl.
*H01R 13/00* (2006.01)
(52) U.S. Cl. .................................. 439/78
(58) Field of Classification Search ........... 439/78, 439/83, 487, 485; 174/266, 84 R; 228/121; 361/234, 794; 269/8
See application file for complete search history.

(56) References Cited

U.S. PATENT DOCUMENTS 5,794,838 A  8/1998 Ushikoshi et al.
5,995,357 A  11/1999 Ushikoshi et al.
6,590,760 B1 * 7/2003 Fujii ................... 361/234
6,617,514 B1  9/2003 Ushikoshi et al.

FOREIGN PATENT DOCUMENTS

| JP | 10-209255 A1 | 8/1998 |
| JP | 11-012053 A1 | 1/1999 |
| JP | 3681824 B2 | 5/2005 |

* cited by examiner

*Primary Examiner*—Alexander Gilman
(74) *Attorney, Agent, or Firm*—Burr & Brown

(57) ABSTRACT

A joining structure joining a ceramic substrate having a metal member buried therein and a power supply connector which supplies power to the metal member is provided. The joining structure includes a counterbore, a stress relaxation insert member, and a brazing member. The counterbore is formed in the ceramic substrate having a large-diameter part and a small-diameter part formed at a bottom center portion of the large-diameter part. At least a part of the metal member is exposed from a bottom of the small-diameter part. The stress relaxation insert member has a body part and a protrusion and is provided in the counterbore so that the body part and the protrusion are fitted into the large-diameter part and the small-diameter part, respectively. The brazing member connects the power supply connector to the stress relaxation insert member, and seals a gap between the counterbore and the stress relaxation insert member.

8 Claims, 6 Drawing Sheets

FIG. 5

| | a | b | c | b/a | c/b | CRACK AFTER JOINING | JOINING STRENGTH (gf·cm) IN JOINING | JOINING STRENGTH (gf·cm) AFTER CONDUCTION CYCLE | NUMBER OF CONDUCTION CYCLES |
|---|---|---|---|---|---|---|---|---|---|
| EXAMPLE 1 | 4.7 | 3 | 0.3 | 0.64 | 0.10 | NOT PRESENT | 15000 | 12600 | 500 |
| CONVENTIONAL EXAMPLE | 4.7 | 4.7 | 0 | 1.00 | 0.00 | NOT PRESENT | 3000 | 1200 | 300 |
| COMPARATIVE EXAMPLE 1 | 4.7 | 0.94 | 0.3 | 0.20 | 0.32 | NOT PRESENT | 3300 | 1500 | 500 |
| EXAMPLE 2 | 4.7 | 1.41 | 0.3 | 0.30 | 0.21 | NOT PRESENT | 13800 | 12000 | 500 |
| EXAMPLE 3 | 4.7 | 3.76 | 0.3 | 0.80 | 0.08 | NOT PRESENT | 13500 | 12300 | 500 |
| COMPARATIVE EXAMPLE 2 | 4.7 | 4.23 | 0.3 | 0.90 | 0.07 | NOT PRESENT | 12600 | 900 | 500 |
| COMPARATIVE EXAMPLE 3 | 4.7 | 3 | 0.09 | 0.64 | 0.03 | NOT PRESENT | 3600 | 1200 | 500 |
| EXAMPLE 4 | 4.7 | 3 | 0.15 | 0.64 | 0.05 | NOT PRESENT | 12600 | 10800 | 500 |
| EXAMPLE 5 | 4.7 | 3 | 6 | 0.64 | 2.00 | NOT PRESENT | 14100 | 12000 | 500 |
| COMPARATIVE EXAMPLE 4 | 4.7 | 3 | 7 | 0.64 | 2.33 | PRESENT | 6900 | UN-MEASURABLE | 500 |
| EXAMPLE 6 | 5.7 | 3 | 0.3 | 0.53 | 0.10 | NOT PRESENT | 15600 | 12000 | 500 |

FIG. 6

| | INSERT MATERIAL | BRAZING FILLER | ACTIVE METAL MATERIAL | JOINING STRENGTH (gf·cm) | |
|---|---|---|---|---|---|
| | | | | IN JOINING | AFTER CONDUCTION CYCLE |
| EXAMPLE 1 | KOVAR | Au ALLOY | NOT PRESENT | 15000 | 12600 |
| EXAMPLE 2 | KOVAR | Au ALLOY | Ti | 15300 | 13800 |
| EXAMPLE 3 | KOVAR | Au ALLOY | Zr | 15000 | 13200 |
| EXAMPLE 4 | KOVAR | Au ALLOY | Hf | 15450 | 12900 |
| EXAMPLE 5 | KOVAR | Au ALLOY | Zr50Hf50 | 15000 | 13200 |
| EXAMPLE 6 | PERMALLOY | Au ALLOY | NOT PRESENT | 14400 | 11400 |

FIG. 7

| | a | b | c | b/a | c/b | INSERT MATERIAL | BRAZING FILLER | JOINING STRENGTH (gf·cm) | |
|---|---|---|---|---|---|---|---|---|---|
| | | | | | | | | IN JOINING | AFTER HEAT CYCLE |
| EXAMPLE 1 | 4.7 | 3 | 0.3 | 0.64 | 0.10 | KOVAR | PURE Al | 12000 | 11700 |
| EXAMPLE 2 | 4.7 | 3 | 0.3 | 0.64 | 0.10 | KOVAR | Al-Mg ALLOY | 11700 | 11400 |
| EXAMPLE 3 | 4.7 | 3 | 0.3 | 0.64 | 0.10 | PERMALLOY | Al-Mg ALLOY | 11400 | 11100 |
| CONVENTIONAL EXAMPLE | 4.7 | 4.7 | 0 | 1.00 | 0.00 | KOVAR | Al-Mg ALLOY | 2400 | 2100 |

US 7,407,391 B2

JOINING STRUCTURE BETWEEN CERAMIC SUBSTRATE AND POWER SUPPLY CONNECTOR

CROSS REFERENCE TO RELATED APPLICATION

This application is based upon and claims the benefit of priority from a Japanese Patent Application No. TOKUGAN 2005-314603, filed on Oct. 28, 2005; the entire contents of which are incorporated herein by reference.

BACKGROUND OF THE INVENTION

The present invention relates to a structure with which to join a ceramic substrate having a metal member buried therein and a power supply connector for supplying power to the metal member (the structure is hereinafter referred to as a "joining structure between the ceramic substrate and the power supply connector.")

The device has heretofore been put to practical use, which generates high-frequency power and heats a ceramic substrate such as aluminum nitride by electrically connecting a power supply connector to a metal member, such as a metal electrode or a metal resistor, which is buried in the ceramic substrate and thus supplying power to the metal member from the power supply connector. In such a device, as disclosed in Japanese Patent Laid-Open No. Hei 10 (1998)-209255, Japanese Patent Laid-Open No. Hei 11 (1999)-12053, and Japanese Patent Publication No. 3681824, an opening is formed in the ceramic substrate so as to expose at least a part of the metal member, and the metal member and the power supply connector are directly joined to each other in a bottom portion of the opening.

SUMMARY OF THE INVENTION

The device has a structure in which the metal member and the power supply connector are joined to each other in the bottom portion of the opening as described above. Thus, strength of a joining part against bending stress is low, and the power supply connector is likely to be disjoined from the metal member by a bending load from the outside. Moreover, oxygen entering from the opening deteriorates the joining part, particularly, the metal member. Accordingly, life of the joining part (electrically connected) is shortened. Against such a background, there is an urgent market need to provide a joining structure between a metal member and a power supply connector, which can maintain higher joining strength and good electrical connection for a long time.

The present invention was made in consideration of the foregoing demand. It is an object of the present invention to provide a joining structure between a ceramic substrate and a power supply connector, which can maintain high joining strength and good electrical connection for a long time.

In order to solve the problems described above, a joining structure between a ceramic substrate in which a metal member is buried and a power supply connector which supplies power to the metal member according to the present invention includes: a counterbore formed in the ceramic substrate so as to have a large-diameter part and a small-diameter part formed at the bottom center of the large-diameter part, at least a part of the metal member is exposed from the bottom of the small-diameter part; a stress relaxation insert member having a body part and a protrusion and being provided in the counterbore in a state where the body part and the protrusion are fitted into the large-diameter part and the small-diameter part, respectively; and a brazing member, which connects the power supply connector to the stress relaxation insert member, and which seals a gap between the counterbore and the stress relaxation insert member.

BRIEF DESCRIPTION OF THE DRAWINGS

FIG. 5 is a table showing results obtained by performing thermal cycle tests on high-frequency generation electrode devices provided with stress relaxation insert members having dimensions of examples 1 to 6, comparative examples 1 to 4, and a conventional high-frequency generation electrode device;

FIG. 6 is a table showing results obtained by performing conduction cycle tests on the high-frequency generation electrode device having the dimensions of example 1 shown in FIG. 5; and FIG. 7 is a table showing results obtained by performing conduction cycle tests on the high-frequency generation electrode devices provided with the stress relaxation insert members having the dimensions of examples shown in FIG. 5 and the conventional high-frequency generation electrode device.

DETAILED DESCRIPTION OF THE INVENTION

Figure 1:
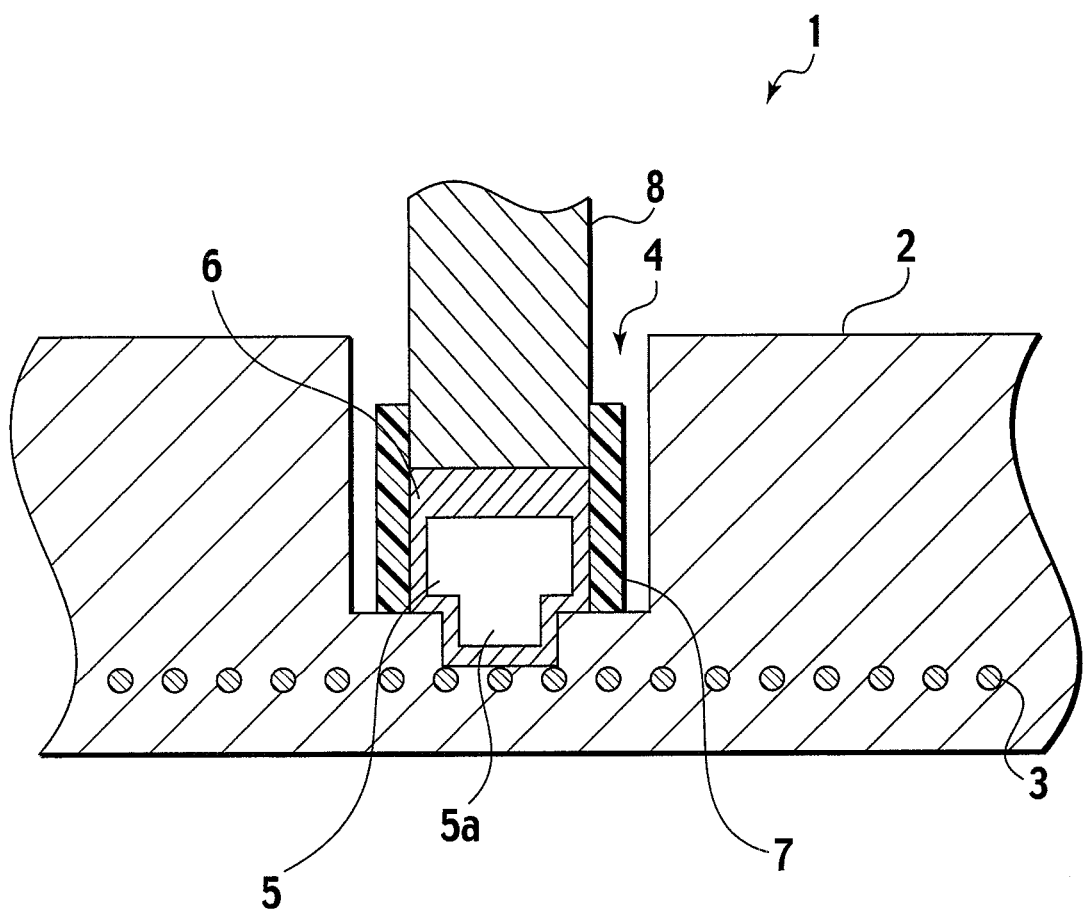
FIG. 1 is a cross-sectional view showing a configuration of a high-frequency generation electrode device of an embodiment of the present invention.

Detailed description of preferred embodiments of the present invention will be given below by referring to the accompanying drawings. It should be noted that the same reference numerals are used in the following drawings among the components having same function, and the same description is not repeated.

The present invention is applicable to a high-frequency generation electrode device which generates high-frequency power by electrically connecting a power supply connector to RF (Radio Frequency) electrodes buried in a ceramic substrate so as to supply power to the RF electrodes through the power supply connector. With reference to the drawings, detailed description will be given below of a configuration of a high-frequency generation electrode device of an embodiment of the present invention and a manufacturing method thereof. Note that application of the present invention is not limited to the high-frequency generation electrode device described above. The present invention is applicable as long as the device has a joining structure between a metal member buried in a ceramic substrate and a power supply connector, such as a heater having a resistor buried in a ceramic substrate, an electrostatic chuck having an electrostatic chuck electrode buried in a ceramic substrate, a heater with an electrostatic chuck having a heating resistor and an electrostatic chuck electrode buried in a ceramic substrate, and a high-frequency generation electrode device with a heater having RF electrodes and a heating resistor buried in a ceramic substrate.

[Configuration of High-Frequency Generation Electrode Device]

First, with reference to FIG. 1, description will be given of a configuration of a high-frequency generation electrode device to be an embodiment of the present invention.

As shown in FIG. 1, a high-frequency generation electrode device 1 of the embodiment of the present invention includes: a roughly disk-shaped ceramic substrate 2 made of AlN (aluminum nitride); and RF electrodes 3 which are buried in the ceramic substrate 2 and made of a Mo (molybdenum) mesh. A counterbore 4 is formed in the ceramic substrate 2 so as to expose a part of the RF electrodes 3. In the counterbore 4, a stress relaxation insert member 5 made of Kovar or Permalloy is provided in such a manner that a protrusion 5a thereof having a shape that fits into a shape of a small-diameter hole of the counterbore 4 is inserted. A space between the counterbore 4 and the stress relaxation insert member 5 is sealed by a brazing member 6 made of a metal material containing at least Au such as Au (gold) —Ni (nickel) solder or Al (aluminum). The stress relaxation insert member 5 is hermetically joined to a feeder rod 8 made of Ni by the brazing member 6 and an atmosphere protecting tube 7.

Figure 2:
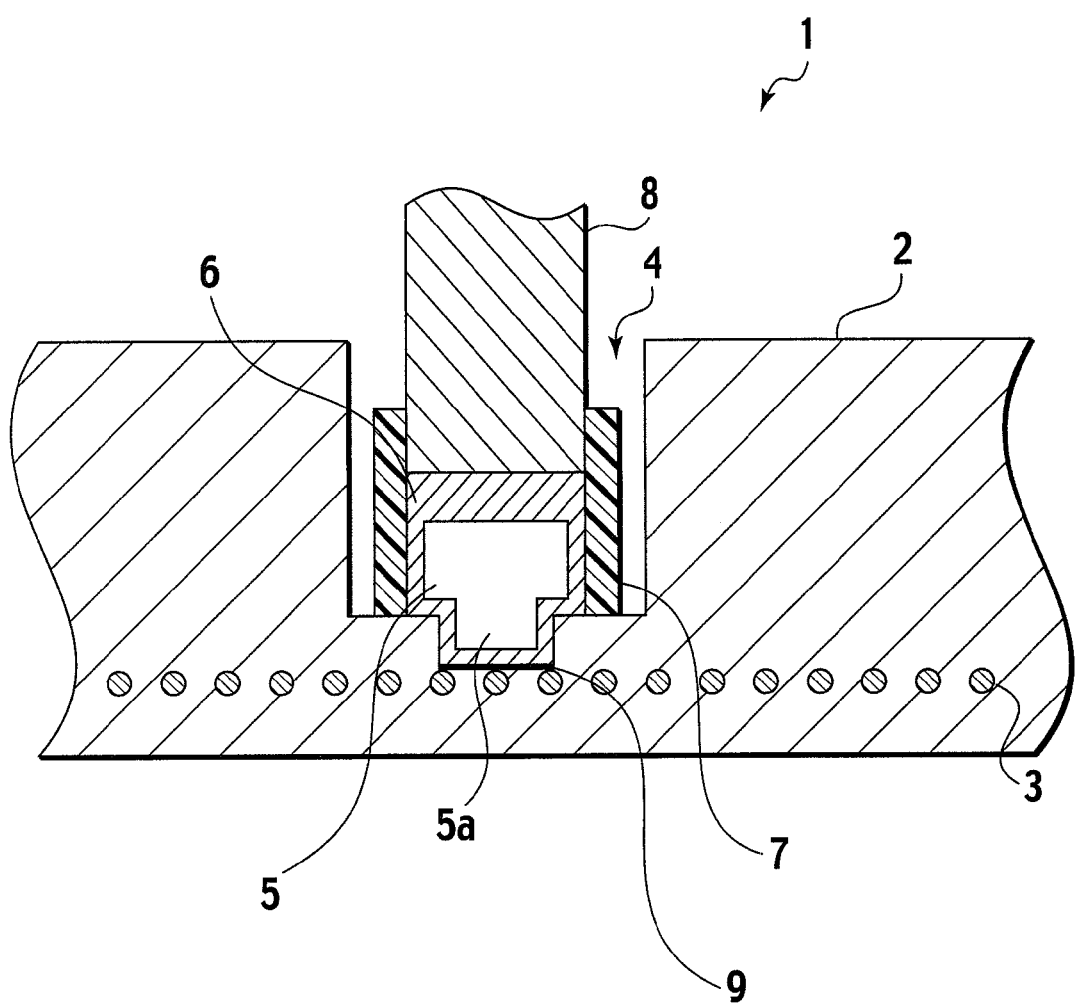
FIG. 2 is a cross-sectional view showing a configuration of an application example of the high-frequency generation electrode device shown in FIG. 1.

The high-frequency generation electrode device 1 having the configuration as described above generates high-frequency power as power supplied to the feeder rod 8 is supplied to the RF electrodes 3 through the stress relaxation insert member 5 and the brazing member 6. Note that, as a configuration of an application of the high-frequency generation electrode device 1, as shown in FIG. 2, an active metal foil 9 containing at least one of Ti (titanium), Zr (zirconium) and Hf (hafnium) may be provided between the RF electrodes 3 and the brazing member 6. By use of the configuration as described above, joining strength between the RF electrodes 3 and the brazing member 6 can be further improved.

[Method of Manufacturing High-Frequency Generation Electrode Device]

Next, with reference to FIGS. 3A to 3C, description will be given of a method for manufacturing the high-frequency generation electrode device 1 described above.

In manufacturing of the high-frequency generation electrode device 1, first, after AlN raw powder is turned into granulated powder by a spray dryer, RF electrodes 3 are buried in the granulated powder and uniaxial press molding is performed thereon. Thereafter, a molded body obtained is subjected to hot press firing in a nitrogen atmosphere at a temperature of 1900° C. and a pressure of 100 kg/cm$^2$. Thus, a roughly disk-shaped ceramic substrate 2 having a configuration as shown in FIG. 3A is fabricated. Note that, the ceramic substrate 2 is fabricated so as to have a diameter of 330 mm and a thickness of 15 mm, in this embodiment.

Figure 3A:
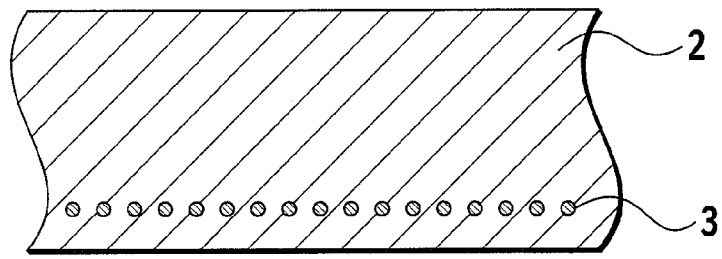
FIGS. 3A to 3C are cross-sectional views showing stages of a method of manufacturing the high-frequency generation electrode device of the embodiment of the present invention.

Next, in the ceramic substrate 2 shown in FIG. 3A, holes such as a lift pin hole (not shown), a terminal hole (not shown) and a counterbore 4 are processed. At the same time, a shaft (not shown) made of AlN, in which a hole for passing a feeder rod 8 is formed, is solid-phase welded. Thereafter, the substrate is subjected to finish processing for its external shape and to cleaning. Thus, the ceramic substrate 2 having a configuration as shown in FIG. 3B is fabricated. Note that the shaft described above is fabricated to have a diameter of 55 mm and a wall thickness of 3 mm, and the terminal hole is fabricated to have a diameter of 7 mm and a depth of 14 mm. Moreover, in this embodiment, the counterbore 4 is fabricated so as to appropriately correspond to a shape of a stress relaxation insert member 5. Specifically, the counterbore 4 is fabricated in such a manner that, when the stress relaxation insert member 5 is provided, a side clearance on one side between the counterbore 4 and the stress relaxation insert member 5 is set at 0.2 mm.

Figure 3B:
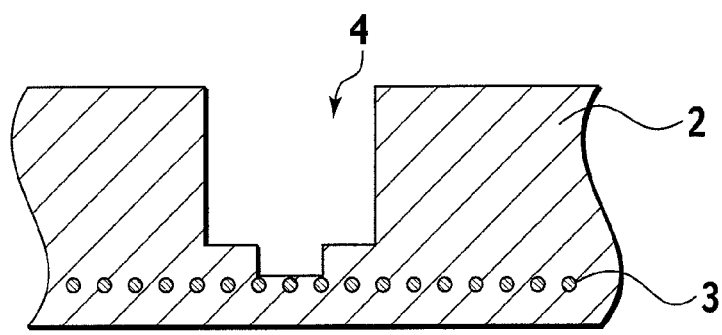
Figure 3C:
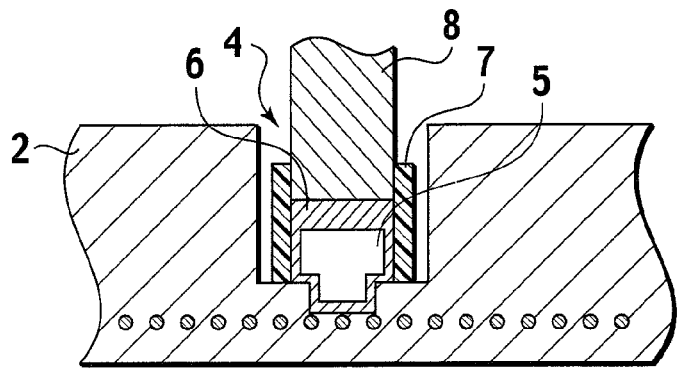

Next, an atmosphere protecting tube 7 is provided in a large-diameter bottom portion of the counterbore 4 in the ceramic substrate 2 shown in FIG. 3B. Moreover, inside the atmosphere protecting tube 7, a brazing member 6 made of Au alloy, the stress relaxation insert member 5 and the feeder rod 8 are sequentially set. Thereafter, the stress relaxation insert member 5 and the feeder rod 8 are hermetically joined to each other by heating to about 1000° C. at a vacuum of 1E-3 Pa in a vacuum furnace. Note that, when the brazing member 6 is made of Al or Al-Mg alloy, a heating temperature is set at about 600° C. By the series of stages described above, the high-frequency generation electrode device 1 is manufactured.

Note that, it is desirable that the stress relaxation insert member 5 should be formed so as for b/a to take on a value in a range of 0.3 to 0.8, where a denotes the horizontal length of a plane of the stress relaxation insert member 5 on which a protrusion 5a is formed, and b denotes the horizontal length of the protrusion 5a. This is because, when the value of b/a is 0.3 or less, a joining area with the RF electrodes 3 is reduced, which does not contribute to improvement in joining strength of a joining part. Moreover, when the value of b/a is 0.8 or more, an exposed area of the RF electrodes 3 is increased too much and thus oxygen easily enters into the joining part. Therefore, life of the joining part is not improved.

Figure 4:
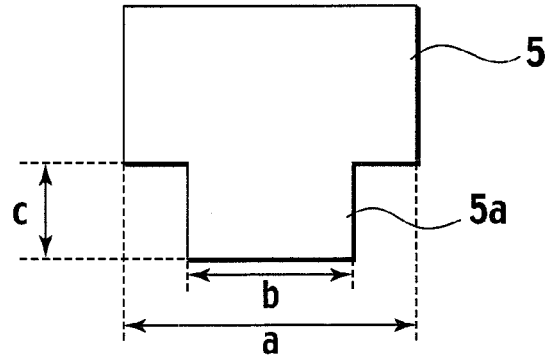
FIG. 4 is a schematic view for explaining dimensions of a stress relaxation insert member shown in FIG. 1.

As shown in FIG. 4, assuming that the protrusion 5a has a height c, it is preferable that the stress relaxation insert member 5 is formed so as to set a value of c/b within a range of 0.05 to 2.0. This is because, when the value of c/b is 0.05 or less, a joining area of the protrusion 5a with a side part of the ceramic substrate 2 is reduced, which does not contribute to improvement in the joining strength of the joining part. Moreover, when the value of c/b is 2.0 or more, a side distance of the joining part is too long and thus residual stress is increased. Therefore, the ceramic substrate 2 is likely to be damaged.

EXAMPLES

Hereinafter, description will be given of some examples of the high-frequency generation electrode device 1 manufactured by use of the manufacturing method described above.

FIG. 5 shows results obtained by respectively performing conduction cycle tests on high-frequency generation electrode devices provided with stress relaxation insert members having the dimensions of examples 1 to 6, high-frequency generation electrode devices provided with stress relaxation insert members having the dimensions of comparative examples 1 to 4, and a conventional high-frequency generation electrode device (without a stress relaxation insert member). Specifically, in the conduction cycle test, a cycle of heating the device from 100° C. to 700° C. at a heating rate of 10° C./min and thereafter, cooling the device from 700° C. to 100° C. at an average cooling rate of 7° C./min in a state where power is being distributed to a RF electrodes is repeated. Note that, in this test, a Kovar material is used as the stress relaxation insert member, and Au alloy is used as a brazing member, Moreover, no active metal foil 9 is provided between the RF electrodes and the brazing member.

As shown in FIG. 5, in the conventional high-frequency generation electrode device, after 300 cycles are completed, joining strength between the RF electrodes and a feeder rod is significantly lowered, and a resistance becomes abnormal due to oxidation of a joining part. Meanwhile, in the high-frequency generation electrode devices provided with the stress relaxation insert members having the dimensions of examples 1 to 6, even after 500 cycles, there is no significant change in joining strength between the RF electrodes and the feeder rod and a resistance value is not increased. Therefore, it is found out that, by use of the high-frequency generation electrode devices of examples 1 to 6, high joining strength and good electrical connection can be maintained for a long time. Note that, in the present specification, the joining strength means a 30A gf·cm of bending moment when the bending moment is applied to the joining part by applying a load A to a tip portion of the 30 cm feeder rod in a direction perpendicular to an axial direction of the feeder rod and the joining part is damaged.

As shown in FIG. 5, in the high-frequency generation electrode devices provided with the stress relaxation insert members having the dimensions of comparative examples 1 to 4, after 500 cycles are completed, joining strength between the RF electrodes and the feeder rod is significantly lowered, and a resistance becomes abnormal due to oxidation of the joining part. Meanwhile, in the high-frequency generation electrode devices provided with the stress relaxation insert members having the dimensions of examples 1 to 6, even after 500 cycles, there is no significant change in the joining strength between the RF electrodes and the feeder rod, and the resistance value is not increased. Therefore, it is understood that, assuming that the stress relaxation insert member 5 has a horizontal length a and the protrusion 5a has a horizontal length b and a height c, it is preferable that the stress relaxation insert member 5 is formed so as to set a value of b/a within a range of 0.3 to 0.8 and a value of c/b within a range of 0.05 to 2.0.

FIG. 6 shows results obtained by performing conduction cycle tests similar to those described above on the high-frequency generation electrode device provided with the stress relaxation insert member having the dimensions of example 1 shown in Table 1. Specifically, the conduction cycle tests are carried out by providing various active metal foils between the RF electrodes and the brazing member of the high-frequency generation electrode device.

As is clear from FIG. 6, it is found out that a degree of deterioration in the joining strength after the conduction cycle test is smaller in the cases where the active metal foils are provided (examples 2 to 5) than in the cases where no active metal foils are provided (examples 1 and 6). Accordingly, it is found out that, in order to improve the joining strength between the RF electrodes and the brazing member, it is preferable that an active metal foil containing at least one of Ti, Zr and Hf is provided between the RF electrodes and the brazing member.

FIG. 7 shows results obtained by performing conduction cycle tests respectively on the high-frequency generation electrode devices provided with the stress relaxation insert members having the dimensions of examples shown in Table 1 and the conventional high-frequency generation electrode device (without a stress relaxation insert member), by changing materials of the stress relaxation insert member and the brazing member. Specifically, in the conduction cycle test, a cycle of heating the device from 100° C. to 500° C. at a heating rate of 10° C./min in a state where power is being distributed to the RF electrodes and, thereafter, cooling the device from 500° C. to 100° C. at an average cooling rate of 7° C./min is repeated.

As is clear from FIG. 7, in the conventional high-frequency generation electrode device, joining strength between the RF electrodes and the feeder rod in joining is weak and a rate of reduction in the joining strength after the conduction cycle test is large. Meanwhile, in the high-frequency generation electrode devices of examples 1 to 3, the joining strength between the RF electrodes and the feeder rod in joining is strong and a rate of reduction in the joining strength after the conduction cycle test is small. Accordingly, it is found out that, by use of the high-frequency generation electrode devices 1 of examples 1 to 3, high joining strength and good electrical connection can be maintained for a long time.

In the joining structure between a ceramic substrate and a power supply connector according to the embodiment of the present invention, the metal member and the power supply connector are joined to each other by use of the stress relaxation insert member provided in the counterbore and the brazing member that seals the entire counterbore. Thus, a joining part thereof is substantially joined to also a side part of the ceramic substrate. Consequently, strength against bending stress can be improved. Moreover, in the joining structure between a ceramic substrate and a power supply connector according to the embodiment of the present invention, the entire joining part between the ceramic substrate and the power supply connector is sealed by the brazing member. Therefore, a rate of oxygen entering the joining part is lowered. Thus, life of the joining part can be extended.

The present invention is not limited to the description and the drawings which constitute a part of the disclosure of the present invention according to the embodiment. Specifically, it may be added that, needless to say, other embodiments, examples, operational technologies and the like, which are made by those skilled in the art based on the embodiment, are all included in the scope of the present invention.

What is claimed is:

1. A joining structure joining a ceramic substrate having a metal member buried therein and a power supply connector which supplies power to the metal member, the joining structure comprising:
    a counterbore formed in the ceramic substrate having a large-diameter part and a small-diameter part formed at a bottom center portion of the large-diameter part, wherein at least a part of the metal member is exposed from a bottom of the small-diameter part;
    a stress relaxation insert member having a body part and a protrusion extending a distance below a bottom surface of the body part and being provided in the counterbore in a state where the body part and the protrusion are fitted into the large-diameter part and the small-diameter part, respectively; and
    a brazing member connecting the power supply connector to the stress relaxation insert member, and sealing a gap between the counterbore and the stress relaxation insert member.

2. The joining structure according to claim 1, wherein the stress relaxation insert member is made of one of Kovar and Permalloy.

3. The joining structure according to claim 1, wherein the brazing member is made of metal material containing one of gold and aluminum.

4. The joining structure according to claim 1, further comprising an active metal foil containing at least one of titanium, zirconium and hafnium, provided between the brazing member and the metal member.

5. The joining structure according to claim 1, wherein the stress relaxation insert member is formed so that a ratio b/a has a value in a range of 0.3 to 0.8 and a ratio c/b has a value in a range of 0.05 to 2.0, wherein "a" denotes a horizontal length of a plane of the stress relaxation insert member on which the protrusion is formed, "b" denotes a horizontal length of the protrusion, and "c" denotes a height of the protrusion; and wherein a side clearance on one side between the counterbore and the stress relaxation insert member is 0.2 mm or less.

6. The joining structure according to claim 1, wherein the brazing member directly connects the power supply connector to the stress relaxation insert member.

7. A joining structure joining a ceramic substrate having a metal member buried therein and a power supply connector which supplies power to the metal member, the joining structure comprising:

a counterbore formed in the ceramic substrate having a large-diameter part and a small-diameter part formed at a bottom center portion of the large-diameter part, wherein at least a part of the metal member is exposed from a bottom of the small-diameter part;

a stress relaxation insert member having a body part and a protrusion extending a distance below a bottom surface of the body part and being provided in the counterbore so that the body part and the protrusion are fitted into the large-diameter part and the small-diameter part, respectively;

a brazing member connecting the power supply connector to the stress relaxation insert member, and sealing a gap between the counterbore and the stress relaxation insert member; and an active metal foil containing at least one of titanium, zirconium and hafnium, provided between the brazing member and the metal member;

wherein the stress relaxation insert member is made of one of Kovar and Permalloy, and the brazing member is made of a metal material containing one of gold and aluminum;

wherein the stress relaxation insert member is formed so that a ratio b/a has a value in a range of 0.3 to 0.8 and a ratio c/b has a value in a range of 0.05 to 2.0, wherein "a" denotes a horizontal length of a plane of the stress relaxation insert member on which the protrusion is formed, "b" denotes a horizontal length of the protrusion, and "c" denotes a height of the protrusion; and wherein a side clearance on one side between the counterbore and the stress relaxation insert member is 0.2 mm or less.

8. The joining structure according to claim 7, wherein the brazing member directly connects the power supply connector to the stress relaxation insert member.

* * * * *